(12) United States Patent
Nakahara et al.

(10) Patent No.: US 8,895,849 B2
(45) Date of Patent: Nov. 25, 2014

(54) PHOTOELECTRIC CONVERSION ELEMENT, MANUFACTURING METHOD THEREOF, OPTICAL SENSOR, AND SOLAR CELL

(75) Inventors: Kentaro Nakahara, Tokyo (JP); Kenji Kobayashi, Tokyo (JP); Masahiro Suguro, Tokyo (JP); Shin Nakamura, Tokyo (JP)

(73) Assignee: NEC Corporation, Tokyo (JP)

(*) Notice: Subject to any disclaimer, the term of this patent is extended or adjusted under 35 U.S.C. 154(b) by 120 days.

(21) Appl. No.: 13/254,790

(22) PCT Filed: Mar. 4, 2010

(86) PCT No.: PCT/JP2010/001508
§ 371 (c)(1),
(2), (4) Date: Sep. 2, 2011

(87) PCT Pub. No.: WO2010/100930
PCT Pub. Date: Sep. 10, 2010

(65) Prior Publication Data
US 2011/0308617 A1 Dec. 22, 2011

(30) Foreign Application Priority Data
Mar. 6, 2009 (JP) .................... 2009-053152

(51) Int. Cl.
*H01L 31/00* (2006.01)
*H01L 51/00* (2006.01)
(Continued)

(52) U.S. Cl.
CPC ........... *H01L 51/0067* (2013.01); *Y02E 10/549* (2013.01); *H01G 9/2031* (2013.01); *H01G*
(Continued)

(58) Field of Classification Search
CPC .. H01G 9/2004; H01G 9/2027; H01G 9/2059
USPC ....................... 548/352.1; 136/263
See application file for complete search history.

(56) References Cited

U.S. PATENT DOCUMENTS 5,464,857 A * 11/1995 Maeda et al. ............ 514/398
2003/0062080 A1 4/2003 Satoh et al.
(Continued)

FOREIGN PATENT DOCUMENTS

GB 1235880 A 6/1971
JP 11-345991 A 12/1999
(Continued)

OTHER PUBLICATIONS

Sugano et al., Nitric Oxide-Induced Accumulation of Lipofuscin-Like Materials Is Caused by Inhibition of Cathepsin S, Current Eye Research, 31:607-616, 2006.*
(Continued)

*Primary Examiner* — James Lin
*Assistant Examiner* — Dujuan Horton
(74) *Attorney, Agent, or Firm* — Sughrue Mion, PLLC (57) ABSTRACT

A photoelectric conversion element is provided which includes a semiconductor electrode (108) containing a semiconductor layer (103) and a dye, a counter electrode (109), and an electrolyte layer (104) disposed between the semiconductor electrode (108) and the counter electrode (109) and in which the dye contains a compound expressed by General Formula 1.
  (where A in General Formula 1 represents a substituted or unsubstituted aromatic group and may contain one or more atoms of oxygen, nitrogen, sulfur, silicon, phosphorus, boron, or halogen and the aromatic group may be obtained by condensing a plurality of aromatic groups).

[Chem. 1]

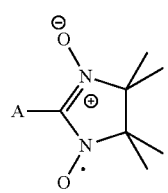

(1)

4 Claims, 8 Drawing Sheets

(51) Int. Cl.
*H01M 14/00* (2006.01)
*H01G 9/20* (2006.01)

(52) U.S. Cl.
CPC ..... *9/2059* (2013.01); *Y02E 10/542* (2013.01); *H01M 14/005* (2013.01)
USPC .......................................... 136/263; 257/40

(56) References Cited

U.S. PATENT DOCUMENTS

| | | | | |
|---|---|---|---|---|
| 2003/0230337 | A1* | 12/2003 | Gaudiana et al. | 136/256 |
| 2007/0125420 | A1* | 6/2007 | Ezure et al. | 136/263 |
| 2010/0081159 | A1* | 4/2010 | Lebedeva et al. | 435/29 |

FOREIGN PATENT DOCUMENTS

| | | | |
|---|---|---|---|
| JP | 2000-277182 A | 10/2000 | |
| JP | 2002-289271 A | 10/2002 | |
| JP | 200878063 A | 4/2008 | |
| WO | 2009016869 A1 | 2/2009 | |

OTHER PUBLICATIONS

Zhang, Zhipan, et al., "The 2,2,6,6-Tetramethyl-1-piperidinyloxy Radical: An Efficient, Iodine-Free Redox Mediator for Dye-Sensitized Solar Cell," Advanced Functional Materials, 2008, pp. 341-346, vol. 18.

Yum, Jun-Ho, et al., "Efficient Far Red Sensitization of Nanocrystalline TiO2 Films by an Unsymmetrical Squaraine Dye", Journal of the American Chemical Society, ACS Publications, US, vol. 129, No. 34, Aug. 29, 2007, pp. 10320-10321.

Extended European Search Report dated Feb. 5, 2013 issued by the European Patent Office in counterpart European Application No. 10748529.4.

Office Action issued Jul. 12, 2013, by the State Intellectual Property Office of the P.R.C. In corresponding application No. 201080010875.X.

* cited by examiner

Z-SHAPED

PHOTOELECTRIC CONVERSION ELEMENT, MANUFACTURING METHOD THEREOF, OPTICAL SENSOR, AND SOLAR CELL

CROSS REFERENCE TO RELATED APPLICATIONS

This application is a National Stage of International Application No. PCT/JP2010/001508, filed on Mar. 4, 2010, which claims priority from Japanese Patent Application No. 2009-053152, filed on Mar. 6, 2009, the contents of all of which are incorporated herein by reference in their entirety

TECHNICAL FIELD

The present invention relates to a photoelectric conversion element, a manufacturing method thereof, an optical sensor, and a solar cell.

BACKGROUND ART

Hitherto, various structures for a photoelectric conversion element converting optical energy into electrical energy have been suggested. Among these, in a dye-sensitized solar cell (Graetzel type) suggested by Graetzel et al, Federal Institute of Technology, Lausanne, Switzerland, 1991, a conversion efficiency of the same level as amorphous silicon was achieved using relatively-cheap materials and simple and easy manufacturing processes. Accordingly, the Graetzel type dye-sensitized solar cell is expected to be put into practical use as a next-generation solar cell.

The Graetzel type dye-sensitized solar cell includes a semiconductor electrode in which a semiconductor layer absorbing dye having a light-absorbing function is formed on a conductive substrate, a counter electrode opposed to the electrode and formed of a conductive substrate, and an electrolyte layer (charge transport layer) disposed between both electrodes. In the Graetzel type dye-sensitized solar cell, electrons are injected into the semiconductor electrode from an excited dye having absorbed light and the electrons moves to the dye by an oxidation reaction of a redox agent in the electrolyte layer. The redox agent in the electrolyte is reduced again in the counter electrode, whereby the cell works. Such photochemical reaction cells using a dye sensitization effect were known in the past. However, in the Graetzel type dye-sensitized solar cell, the effective reaction surface area increases by 1000 times by using a porous titania electrode formed by sintering particulates as the semiconductor electrode, thereby extracting a larger photocurrent.

An example of the dye used in the Graetzel type dye-sensitized solar cell is a spectral sensitizing dye including a transition metal complex as described in Patent Document 1. More specifically, cisbis(isothiocyanato)-bis-(2,2'-bipyridil-4,4-dicarboxylate)ruthenium(II) bis-tetrabutylammonium complex (so-called N719) which is a kind of bipyridine complex and which has an excellent effect as the sensitizing dye is typically used as the spectral sensitizing dye. In addition, cisbis(isothiocyanato)-bis-(2,2'-bipyridil-4,4'-dicarboxylate) ruthenium(II)(so-called N3) which is a kind of bipyridine complex or tris(isothiocyanato)(2,2':6',2''-terpyridil4,4',4''-tricarboxylate) ruthenium(II)tros-tetrabutylammonium complex (so-called black dye) which is a kind of tripyridine complex is typically used. In recent years, organic materials not containing a metal complex, such as derivatives of coumarin-based materials, have been reported.

Regarding the electrolyte layer used in the Graetzel type dye-sensitized solar cell, a method of interposing an electrolyte, which is obtained by dissolving a redox agent containing iodine and/or iodide ions in a nitrile-based organic solvent or an ionic liquid with low volatility, between the semiconductor electrode and the counter electrode is typically used. Since iodine with high corrosivity is used in such a method, Patent Document 2 discloses that the electrolyte is made into a pseudo-solid by gelation so as to prevent leakage of liquid to the outside. It was also reported that 2,2,6,6-tetramethylpiperidine-N-oxyl (TEMPO) radical is used as a redox agent not containing iodine (Non-Patent Document 1).

RELATED DOCUMENT

Patent Document

[Patent Document 1] Japanese Laid-open Patent Publication No. 11-345991
[Patent Document 2] Japanese Laid-open Patent Publication No. 2002-289271

Non-Patent Document

[Non-Patent Document 1] "The 2,2,6,6-Tetramethyl-1-piperidinyloxy Radical: An Efficient, Iodine-Free Redox Mediator for Dye-Sensitized Solar Cells", Z. Zhang, P. Chen, T. N. Murakami, S. M. Zakeeruddin, M. Graetzel, Advanced Functional Materials, Vol. 18, 2008, p. 341~346

DISCLOSURE OF THE INVENTION

Problem to be Solved by the Invention

Hitherto, the Graetzel type dye-sensitized solar cell has been exemplified. Such photoelectric conversion elements have been variously studied and have room for improvement in terms of usefulness.

A goal of the invention is to provide a photoelectric conversion element excellent in usefulness.

Means for Solving the Problem

According to the invention, there is provided a photoelectric conversion element including: a semiconductor electrode that includes a semiconductor layer and a dye; a counter electrode; and an electrolyte layer that is disposed between the semiconductor electrode and the counter electrode, wherein the dye contains a compound expressed by General Formula 1.

[Chem. 1]

(1)

(where A in General Formula 1 represents a substituted or unsubstituted aromatic group and may contain one or more atoms of oxygen, nitrogen, sulfur, silicon, phosphorus, boron, or a halogen and the aromatic group may be obtained by condensing a plurality of aromatic groups).

According to the invention, there is provided an optical sensor including the photoelectric conversion element. According to the invention, there is provided a solar cell including the photoelectric conversion element.

According to the invention, there is provided a method of manufacturing a photoelectric conversion element, including: acquiring a semiconductor electrode by causing a porous semiconductor material to adsorb a dye; impregnating the semiconductor electrode with an electrolyte; and disposing a counter electrode to be opposed to the semiconductor electrode impregnated with the electrolyte, wherein the dye contains a compound expressed by General Formula 1.

Advantageous Effect

According to the invention, it is possible to implement a photoelectric conversion element excellent in usefulness, by using a compound having a specific structure expressed by General Formula 1.

DESCRIPTION OF EMBODIMENTS

Hereinafter, embodiments of the invention will be described with reference to the accompanying drawings. In all the drawings, like elements are referenced by like reference numerals and signs and will not be repeated.
(First Embodiment)

Figure 1:
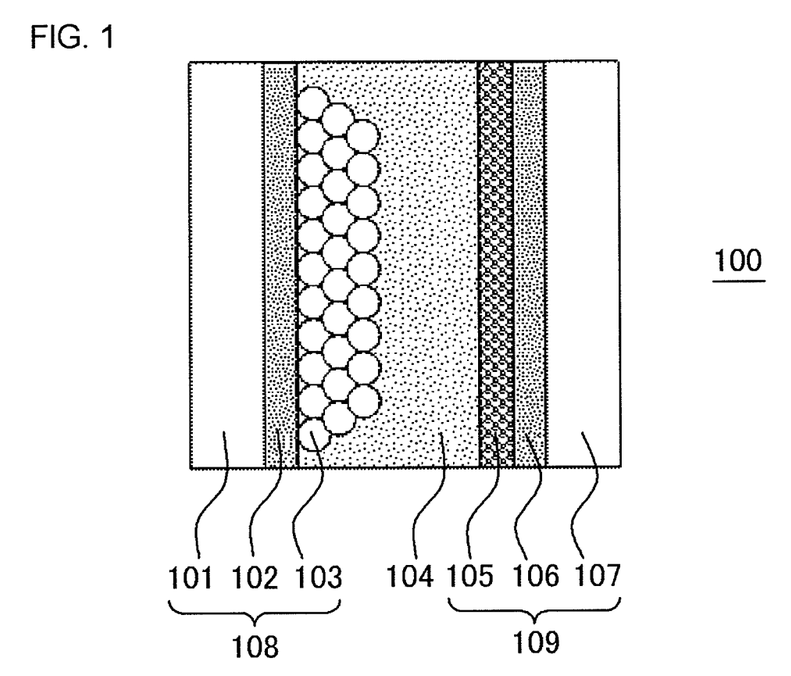
FIG. 1 is a sectional view schematically illustrating the configuration of a photoelectric conversion element according to an embodiment of the invention.

FIG. 1 is a sectional view illustrating the configuration of a photoelectric conversion element according to an embodiment of the invention. A photoelectric conversion element 100 shown in FIG. 1 includes a semiconductor electrode 108, a counter electrode 109, and an electrolyte layer 104 held between both electrodes, and is an element receiving optical energy by the use of radicals and extracting the optical energy to the outside via semiconductor. Hereinafter, elements of the photoelectric conversion element 100 will be described.

(i) Semiconductor Electrode

The semiconductor electrode 108 includes a semiconductor layer 103 and a dye (not shown in the drawing) adsorbed to the semiconductor layer 103. In FIG. 1, the semiconductor electrode 108 has a structure in which a conductive substrate (a transparent substrate 101 and a transparent conductive film 102) and a semiconductor layer 103 are sequentially stacked from the outside to the inside of the element.

(i-1) Conductive Substrate

The conductive substrate may be a substrate having conductivity or may be a substrate having a conductive layer formed thereon. Examples of the substrate include a glass substrate, a plastic substrate, and a metal substrate. Among these, a substrate having high transparency (the transparent electrode 101) is particularly preferably used. The type of the conductive layer formed on the substrate is not particularly limited, but a conductive layer (the transparent conductive film 102) formed of transparent materials such as indium-tin-oxide (ITO), fluorine-doped tin oxide (FTO), indium zinc oxide (IZ), and tin oxide (SnO2) can be preferably used. The transparent conductive layer may be formed in a film shape on the entire or partial surface of the substrate. The manufacturing method and the thickness of the conductive layer can be properly selected. The thickness thereof is, for example, in the range of 0.1 to 5 µm.

(i-2) Semiconductor Layer (i-2-1) Material Structure of Semiconductor Layer

Examples of the material of the semiconductor layer 103 include known semiconductor materials such as titanium dioxide, zinc oxide, tungsten oxide, barium titanate, strontium titanate, and cadmium sulfide. There semiconductor materials may be used alone or by combination of two or more kinds for use. Among these, the semiconductor layer 103 is preferably formed of a semiconductor layer containing titanium dioxide in terms of conversion efficiency, stability, and safety. Specific examples of titanium dioxide include various titanium dioxides such as anatase-type titanium dioxide, rutile-type titanium dioxide, amorphous titanium dioxide, metatitanic acid, and orthotitanic acid and titanium dioxide-containing complex. Among these, the anatase titanium dioxide is preferably used in terms of further improvement of stability of the photoelectric conversion.

Examples of the shape of the semiconductor layer 103 include the porous semiconductor layer obtained by sintering semiconductor particulates and the like and a filmy semiconductor layer obtained by the use of a sol-gel method, a sputtering method, a spray-pyrolysis method, and the like. A fibrous semiconductor layer or a semiconductor layer 103 having a needle-like crystal form can be used. The shape of the semiconductor layer 103 can be properly selected depending on the application purpose of the photoelectric conversion element 100.

Among these, in terms of an amount of dye adsorbed, the semiconductor layer 103 having a large specific surface area, such as the porous semiconductor layer and the semiconductor layer having a needle-like crystal form, can be preferably used. In terms of adjustment of the utilization ratio of incident light and the like by the use of the particle diameter of the semiconductor particulates, it is preferable that the porous semiconductor layer formed of semiconductor particulates is used as the semiconductor layer 103.

The semiconductor layer 103 may have a single layer or multiple layers. It is possible to more easily form a semiconductor layer with a sufficient thickness by forming the semiconductor layer out of multiple layers.

The porous multi-layered semiconductor layer formed of semiconductor particulates may include plural semiconductor layers having different diameters of semiconductor particulates. For example, by setting the average diameter of the semiconductor particulates of the semiconductor layer (a first semiconductor layer) close to the light incidence side to be smaller than that of the semiconductor layer (a second semiconductor layer) apart from the light incidence side, the first semiconductor layer absorbs a large amount of light, the second semiconductor layer efficiently reflects the light passing through the first semiconductor layer and returns the reflected light to the first semiconductor layer, and the first semiconductor layer absorbs the reflected light, thereby further improving the total light-absorbing characteristic. The thickness of the semiconductor layer 103 is not particularly limited, but is preferably set to be, for example, equal to or greater than 0.5 μm and equal to or less than 45 μm, in terms of transmittance and conversion efficiency.

The specific surface area of the semiconductor layer 103 can be set to be, for example, equal to or greater than 10 m2/g and equal to or less than 200 m2/g, in terms of adsorption of a large amount of dye.

In the configuration in which dyes is adsorbed to the porous semiconductor layer 103, the porosity of the porous semiconductor layer 103 is set to be, for example, equal to or greater than 40% and equal to or less than 80%, so as to satisfactorily diffuse ions in the electrolyte to transport charges. The porosity is a ratio of voids in the semiconductor layer to the volume of the semiconductor layer 103 in terms of percentage.

(i-2-2) Method of Forming Semiconductor Layer

The method of forming the semiconductor layer 103 will be described using the porous semiconductor layer as an example. The porous semiconductor layer is formed as follows. For example, semiconductor particulates along with an organic compound such as polymer and a dispersing agent are added to a dispersion medium such as an organic solvent or water, thereby preparing a suspension. The suspension is applied onto a conductive substrate (the transparent conductive film 102 in FIG. 1) and the resultant is dried and backed at a high temperature.

When the organic compound along with the semiconductor particulates is added to the dispersion medium, the organic compound is combusted at the time of baking, thereby guaranteeing satisfactory pores in the porous semiconductor layer. By controlling the molecular weight or the addition amount of the organic compound combusted at the time of backing, it is possible to change the porosity. The type or amount of the organic compound can be properly selected depending on the particulate state, the total weight of the suspension, and the like. However, when the ratio of the semiconductor particulates is equal to or greater than 10 wt % with respect to the total weight of the suspension, it is possible to further enhance the strength of the formed film. When the ratio of the semiconductor particulates is equal to or less than 40 wt % with respect to the total weight of the suspension, it is possible to more stably obtain the porous semiconductor layer having high porosity. Accordingly, it is preferable that the ratio of the semiconductor particulates is equal to or greater than 10 wt % and equal to or less than 40 wt % with respect to the total weight.

Particles of a single or compound semiconductor having a proper average diameter, for example, an average diameter of 1 to 500 nm are used as the semiconductor particulates. In terms of an increase in specific surface area, the average diameter is preferably in the range of 1 to 50 nm. In order to enhance the utilization ratio of incident light, relatively large semiconductor particles with an average diameter of 200 to 400 nm may be added thereto.

Examples of the method of forming the semiconductor particulates include a sol-gel method such as a hydrothermal method, a sulfuric acid method, and a chlorine method, and any method can be used, as long as it can form target particulates. In terms of crystallization, the hydrothermal method can be preferably used.

The organic compound is not particularly limited, as long as it can be dissolved in a suspension and can be combusted and removed at the time of baking at a high temperature. Examples thereof include polymers such as polyethylene glycol and ethyl cellulose. Examples of the dispersion medium of the suspension include: glyme-based solvents such as enthylene glycol monomethyl ether; alcohols such as isopropyl alcohols; mixture solvents such as isopropyl alcohol/toluene; and water.

Known methods such as a doctor blade method, a squeegee method, a spin coating method, and a screen printing method can be used as the method of applying the suspension. Thereafter, the applied film is dried and backed. The drying and baking conditions include, for example, an atmosphere of air or inert gas, a temperature in the range of 50 to 800° C., and a time in the range of 10 seconds to 12 hours. The drying and baking can be performed once at a single temperature or twice or more with a temperature varying.

Here, the method of forming the porous semiconductor layer has been described but various known methods can be used to form other types of semiconductor layers 103.

(i-3) Dye

In this embodiment, the dye serves as a light sensitizer and specifically, has a structure of 4,4,5,5-tetraalkyl-imidazoline-1-oxyl-3-oxide expressed by General Formula 1.

[Chem. 2]

(1)

(where A in General Formula 1 represents a substituted or unsubstituted aromatic group and may contain one or more atoms of oxygen, nitrogen, sulfur, silicon, phosphorus, boron, or halogen and the aromatic group may be obtained by condensing a plurality of aromatic groups).

In General Formula 1, A represents a substituted or unsubstituted aromatic group. The aromatic group in the invention means a cyclic unsaturated organic substituent and specific examples thereof include an aromatic carbonhydride group, an aromatic heterocycle group, and a condensed polycyclic aromatic group.

More specific example of the aromatic group A include a phenyl group, a biphenyl group, terphenyl group, a tetrakisphenyl group, a styryl group, a naphthyl group, an anthryl group, an acenaphthenyl group, a fluorenyl group, a phenanthryl group, an indenyl group, a pyrenyl group, a pyridyl group, a bipyridyl group, a pyridazyl group, a pyrimidyl group, a pyrazyl group, a furanyl group, a pyronil group, a thiophenyl group, a isoquinolyl group, an imidazolyl group, a benzofuranyl group, a benzothiophenyl group, an indolyl group, a carbazolyl group, a benzoxazolyl group, a quinoxalyl group, a benzoimidazolyl group, a pyrazolyl group, a dibenzofuranyl group, and a debenzothiophenyl group. Among these, in terms of stability, it is preferably that A is one selected from the group of a phenyl group, a pyridyl group, and a bipyridyl group.

Examples of the substituent (the substituent in the aromatic group A) for the aromatic groups include an alkyl group (for example, with a carbon number of 1 to 5), a hydroxyl group, a carboxyl group, a formyl group, a fluorine atom, a chlorine atom, a cyano group, a nitro group, an alkoxy group (for example, with a carbon number of 1 to 5), an amino group, a substituted amino group, a trifluoromethyl group, a phenyl group, a tolyl group, a naphthyl group, an aralkyl group, a hydroxyalkyl group (for example, with a carbon number of 1 to 5), a sulfonate group, an ester group (for example, with a carbon number of 1 to 5), a mercapto group, and a phosphonyl group. The aromatic group A may include one or two or more of the above-described examples. When the aromatic group A has plural substituents, they may be the same kind or different kinds.

In terms of easy adsorption of the dye to the surface of the porous semiconductor surface, it is preferable that the aromatic group A has an interlock group as a substituent. The interlock group serves to provide an electrical coupling of facilitating the electron migration between the excited dye and the conduction band of the semiconductor. Examples of the interlock group include a carboxyl group, an alkoxy group (for example, with a carbon number of 1 to 3), a hydroxyl group, a hydroxyalkyl group (for example, with a carbon number of 1 to 3), a sulfonate group, an ester group (for example, with a carbon number of 1 to 3), a mercapto group, and a phosphonyl group. In terms of more stable adsorption of the dye to the surface of the porous semiconductor, it is preferable that the carboxyl group is used.

When the aromatic group A has the hydroxyl group or the carboxyl group as a substituent, the hydroxyl group or the carboxyl group may form a salt in cooperation with metal ions of lithium, sodium, magnesium, potassium, calcium, and the like.

An example of a preferred compound among the compounds expressed by General Formula 1 is 2-(4-carboxyphenyl)-4,4,5,5-tetramethylimidazoline-1-oxyl-3-oxide expressed by General Formula 2 expressed by Formula 2. By using the compound expressed by Formula 2, it is possible to improve the dye sensitization effect to the surface of the porous semiconductor.

[Chem. 3]

(2)

In the photoelectric conversion element 100, the following compounds can be combined and used as the compound expressed by General Formula 1 and serving as a light sensitizer.

A compound expressed by Formula 2 and a compound in which A in General Formula 1 has one or more substituents selected from the group of an alkoxy group, a hydroxyl group, a hydroxyalkyl group, a sulfonate group, an ester group, a mercapto group, and a phosphonyl group.

The dye may be a dimer having two coupled structures of 4,4,5,5-tetramethyl imidazoline-1-oxyl-3-oxide in a compound, a trimer having three coupled structures thereof, a tetramer having four coupled structures thereof, an oligomer having plural coupled structures thereof, or a part of a polymer having plural coupled structures. The polymer may have a chained shape, a cyclic shape, or a branched shape.

An example of the method of adsorbing the dye to the semiconductor layer 103 is a method of immersing the semiconductor layer 103 formed on the substrate in a solution in which the dye is dissolved. Examples of the solvent used to dissolve the dye include: alcohols such as ethanol; ketones such as acetone; ethers such as diethylether and tetrahydrofuran; nitrogen compounds such as acetonitrile; halogenated aliphatic hydrocarbons such as chloroform; aliphatic hydrocarbons such as hexane; aromatic hydrocarbons such as benzene; and esters such as acetic ethyl. Two or more of these solvents may be combined and used.

The dye concentration in the solution and the types of the dye and the solvent to be used can be properly adjusted. In terms of improvement of the adsorption function, a high concentration to a certain extent is preferable. For example, the concentration is preferably equal to or more than $5 \times 10^{-5}$ mol/L.

The temperature and pressure of the solution and the atmosphere at the time of immersing the semiconductor layer in the solution in which the dye is dissolved are not particularly limited, and the room temperature and the atmospheric pressure can be used. The immersing time can be properly adjusted depending on the dye, the type of the solvent, and the concentration of the solution. For the purpose of effectiveness, the immersing can be performed in a heated state. Accordingly, it is possible to more efficiently adsorb the dye to the semiconductor layer 103.

In order to control the dye and the adsorption state thereof or the surfaces of the particulates of TiO2 constituting the porous semiconductor layer, the organic compound such as deoxylchlic acid, guanidine thiocyanate, tert-butylpyridine, or ethanol may be added to the solution in which the dye is dissolved.

(ii) Counter Electrode

An example of the counter electrode 109 is a structure in which a layer (a catalyst layer 105) containing metal catalyst such as platinum or carbon is present on a support substrate (the transparent conductive film 106 and the transparent substrate 107).

In the photoelectric conversion element 100, the counter electrode 109 has a structure in which the transparent substrate 107, the transparent conductive film 106, and the catalyst layer 105 are sequentially stacked from the outside of the element to the electrolyte layer 104.

The catalyst layer 105 may be formed in a film shape on the entire or partial surface of the transparent conductive film 106. Platinum can be preferably used as the material of the catalyst layer 105, in that its catalyst function is excellent. The catalyst layer 105 may have a thickness sufficient to exhibit the catalyst function and the specific thickness thereof may be in the range of 1 to 2000 nm.

Examples of the support substrate include the transparent substrate 107 formed of glass or polymer film and a metal plate (foil). Particularly to lower the resistance value of the counter electrode 109, a conductive substrate can be preferably used as the support substrate.

The counter electrode 109 may be formed on the same substrate as the semiconductor layer electrode (the semiconductor electrode 108). In this case, by cutting the conductive layer between the counter electrode 109 and the semiconductor electrode 108 by the use of a laser scriber or the like, two or more electrodes may be formed on the same substrate.

(iii) Electrolyte Layer

The electrolyte layer 104 has a function of transporting charges between the semiconductor layer 103 and the counter electrode 109. The electrolyte layer 104 contains, for example, an electrolyte, a solvent, and additives. In the photoelectric conversion element 100, the electrolyte layer 104 is formed of, for example, an electrolyte solution in which the electrolyte is dissolved in an organic solvent and the electrolyte contains iodine and iodide ions.

Examples of the electrolyte include: combinations of metal iodide such as LiI, NaI, KI, CsI, and CaI2 and iodide which is an iodine salt of a quaternary ammonium compound such as tetraalkyl ammonium iodide, pyridium iodide, and imidazolium iodide with I2; combinations of metal bromide such as LiBr, NaBr, KBr, CsBr, and CaBr2 and bromide which is a bromine salt of a quaternary ammonium compound such as tetraalkyl ammonium bromide, pyridium bromide, and imidazolium bromide with Br2; metal complex such as ferrorcyanic salt-ferricyanic salt or ferrocene-ferricinium ions; sulfur compounds such as sodium polysulfide and alkylthiolalkyl disulfide; viologen dye; and hydroquinonequinone. Two or more of the electrolytes may be combined and used.

A more specific example of the electrolyte is a combination of one or more iodides selected from the group consisting of LiI, pyridium iodide and imidazolium iodide with I2.

Compounds exhibiting an excellent ion conduction property such as low viscosity, high ion mobility, high dielectric constant, and high effective carrier concentration can be preferably used as the solvent used along with the electrolyte.

Examples of the solvent include: carbonate compounds such as enthylene carbonate and propylene carbonate; heterocyclic compounds such as 3-methyl-2-oxazolidinone; ether compounds such as dioxane and diethyl ether; chained ethers such as ethylene glycol dialkyl ether, propylene glycol dialkyl ether, polyethylene glycol dialkyl ether, and polypropylene glycol dialkyl ether; alcohols such as methanol, ethanol, ethylene glycol monoalkyl ether, propylene glycol monoalkyl ether, polyethylene glycol monoalkyl ether, and polypropylene glycol monoalkyl ether; multi-valent alcohols such as enthylene glylcol, propylene glycol, polyethylene glycol, polypropylene glycol, and glycerin; nitrile compounds such as acetonitrile, glutarodinitrile, methoxy acetonitrile, propionitrile, and benzonitrile; non-proton polar materials such as dimethyl sulfoxide and sulfolane; and water.

When the electrolyte is dissolved in the solvent and used as the electrolyte layer 104, the electrolyte concentration in the solution is for example in the range of 0.1 to 5 mol/L. When iodine is added to the electrolyte, the additive concentration is for example in the range of 0.01 to 0.5 mol/L.

A basic compound such as t-butyl pyridine, 2-picoline, and 2,6-lutidine may be added to the electrolyte layer 104. When the basic compound is added, the additive concentration is for example, in the range of 0.05 to 2 mol/L.

Solid electrolyte may be used for the electrolyte layer 104. In this case, complete solid electrolyte or gel electrolyte can be used as the solid electrolyte. A mixture of electrolyte and ion-conductive polymer compound can be used as the complete solid electrolyte. Examples of the ion-conductive polymer compound include polar polymer compounds such as polyethers, polyesters, polyamines, and polysulfides. A material in which electrolyte or normal-temperature molten salt is added to a gelation agent can be used as the gel electrolyte. A polymer gelation agent is suitably used as the gelation agent. Examples thereof include polymer gelation agents such as derivatives of cross-linked polyacryl resin, derivatives of cross-linked polyacrylonitrile, derivatives of polyalkylene oxide, silicone resins, and polymer having a nitrogen-containing heterocyclic quaternary compound salt structure. Nitrogen-containing heterocyclic quaternary ammonium salt compounds such as pyridinium salts and imidazolium salts are suitably used as the normal-temperature molten salt in terms of improvement in stability of the electrolyte layer 104.

In terms of injection of polymer electrolyte into a semiconductor layer to further improve the photoelectric conversion efficiency, it is preferable that the porous semiconductor layer is impregnated with a liquid monomer solution and then the resultant is polymerized at the time of forming the electrolyte layer using the solid electrolyte. Examples of the polymerization method include a photopolymerization method and a thermal polymerization method.

The photoelectric conversion element 100 is manufactured, for example, in the following procedure:

Step 11: a step of adsorbing dye to a porous semiconductor material to acquire the semiconductor electrode 108;

Step 12: a step of impregnating the semiconductor electrode 108 with the electrolyte; and Step 13: a step of disposing the counter electrode 109 to face the semiconductor electrode 108 impregnated with the electrolyte.

The dye used in step 11 contains the compound expressed by General Formula 1.

Since the obtained photoelectric conversion element 100 includes the organic compound having the structure of aromatic-substituted 4,4,5,5-tetraalkylimidazoline-1-oxyl-3-oxide expressed by General Formula 1 as the dye, it is possible to implement a photoelectric conversion element which an excellent photoelectric conversion efficiency, excellent manufacturing stability, and high usefulness at a relatively low cost.

(Second Embodiment)

The photoelectric conversion element (FIG. 1) according to the first embodiment is very suitably used, for example, as a dye-sensitized solar cell.

When solar light is applied from the side of the transparent substrate 101 of the photoelectric conversion element 100, the solar light passes through the transparent substrate 101 and the transparent conductive film 102 in this order and is applied to the dye (not shown in the drawing) adsorbed to the semiconductor layer 103. The dye absorbs the light and is thus excited. Electrons generated by this excitation migrate to the transparent conductive film 102 from the semiconductor layer 103. The electrons migrating to the transparent conductive film 102 migrates to the counter electrode 109 via an external circuit and returns to the dye via the electrolyte layer 104 from the counter electrode 109. In this way, current flows to constitute a solar cell.

Plural photoelectric conversion elements according to the invention can be used as a photoelectric conversion element stack for a solar photovoltaic system.

Figure 2:
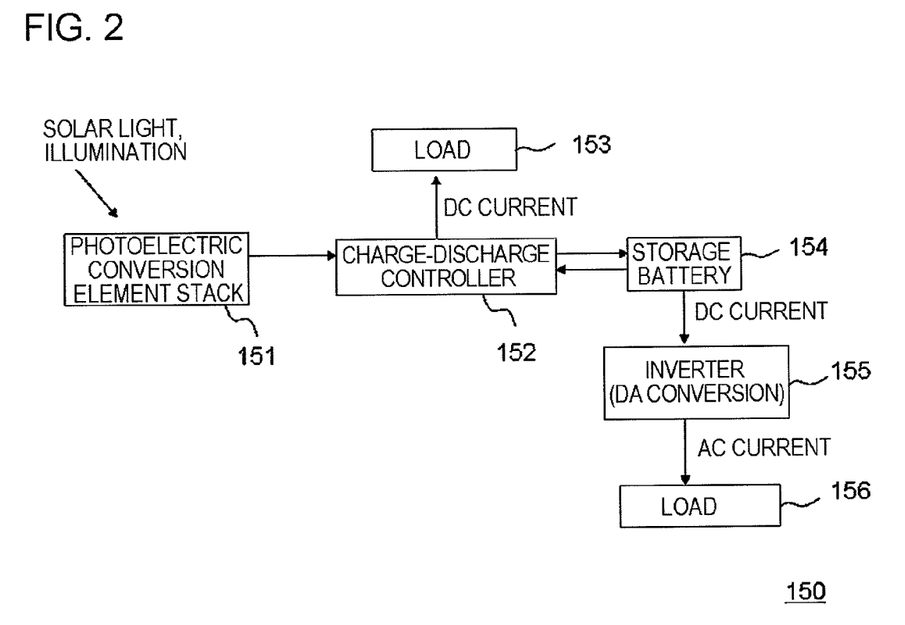
FIG. 2 is a diagram illustrating the configuration of a solar photovoltaic system according to an embodiment of the invention.

FIG. 2 is a diagram illustrating a specific example of a solar photovoltaic system. In the solar photovoltaic system 150 shown in FIG. 2, electrons generated in the photoelectric conversion element stack 151 migrate to a storage battery 154 via a charge-discharge controller 152. A load 153 is connected to the charge-discharge controller 152. The DC current from the storage battery 154 is converted in a DA conversion manner by an inverter 155 and flows in a load 156.

The configuration of the photoelectric conversion element stack 151 is not particularly limited and examples thereof are shown in FIGS. 3 to 6. FIGS. 3 to 6 are sectional views the configurations of the photoelectric conversion elements 151.

Figure 3:
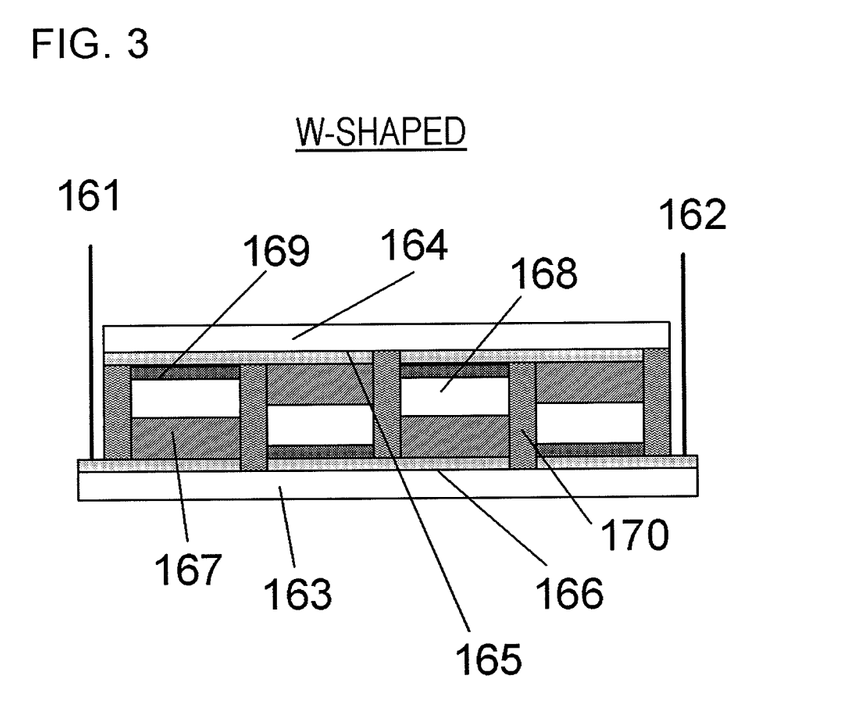
FIG. 3 is a sectional view illustrating the configuration of a photoelectric conversion element stack according to the embodiment.

FIG. 3 shows a W-shaped stack module.

In FIG. 3, plural photoelectric conversion elements each including a photoelectrode 167, an electrolyte 168, and a counter electrode (the counter electrode) 169 are disposed between a transparent substrate 163 and a transparent substrate 164. The photoelectrode 167 is formed of, for example, the semiconductor layer 103 according to the first embodiment. A transparent conductive film 166 and a transparent conductive film 165 are disposed between the transparent substrate 163 and the photoelectrode 167 and between the transparent substrate 164 and the counter electrode 169. These transparent conductive films are disposed in common to the photoelectrode 167 of an element and the counter electrode 169 of an element adjacent thereto, whereby the adjacent elements are connected to each other. The plural transparent conductive films 165 and the plural transparent conductive films 166 are sealed and isolated from each other with a sealing member 170 formed of an insulating material. Both ends of the transparent substrate 163 are connected to an anode (minus electrode) 161 and a cathode (plus electrode) 162, respectively.

Figure 4:
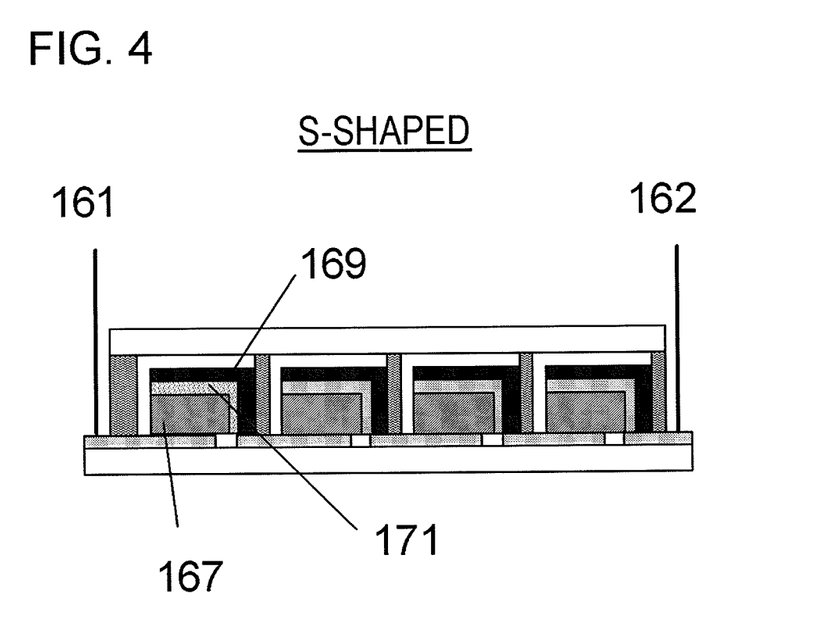
FIG. 4 is a sectional view illustrating the configuration of a photoelectric conversion element stack according to the embodiment.

FIG. 4 shows an S-shaped stack module.

In FIG. 4, a photoelectrode 167 is disposed on the transparent conductive film 166 and a separator 171 covering the photoelectrode 167 and a counter electrode 169 covering the entire surface of the separator 171 are disposed on the top surface and the side surface of the photoelectrode 167, whereby an element is constituted. In FIG. 4, the photoelectrode 167 of an element and the counter electrode 169 of an element adjacent thereto are disposed on a single transparent substrate 163 via a common transparent conductive film 166.

Figure 5:
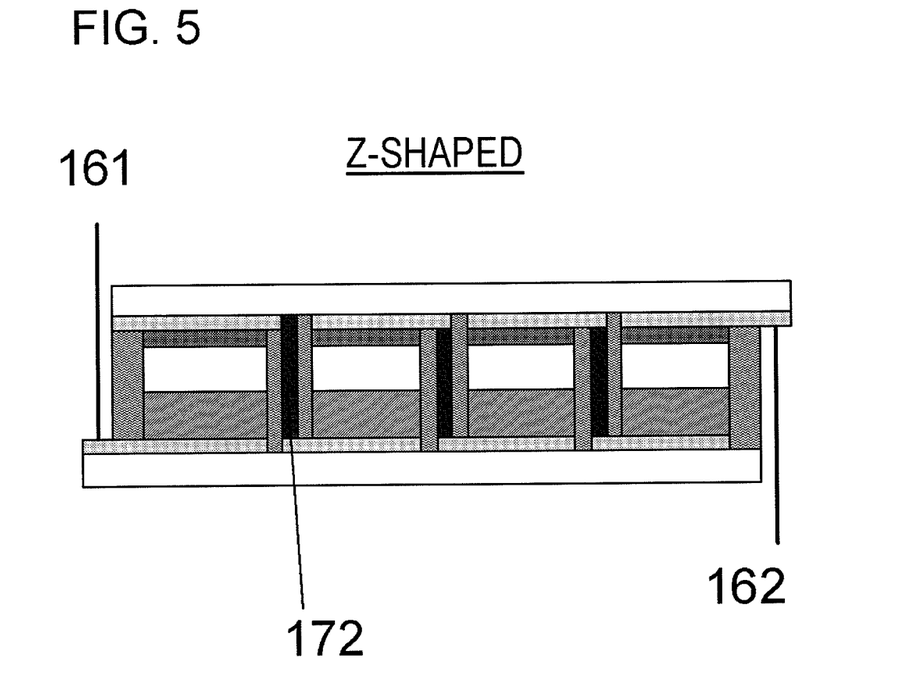
FIG. 5 is a sectional view illustrating the configuration of a photoelectric conversion element stack according to the embodiment.

FIG. 5 shows a Z-shaped stack module.

The basis configuration of FIG. 5 is the same as the W-shaped stack module shown in FIG. 3, but a transparent conductive film 165 and a transparent conductive film 166 are disposed for each element in FIG. 5. The photoelectrode 167 of an element is connected to the counter electrode 169 of an element adjacent thereto via the transparent conductive film 166, a conductive sealing member 172, and the transparent conductive film 165 of the adjacent element. The side outer periphery of the conductive sealing member 172 is covered with sealing members 170, except for regions coming in contact with the transparent conductive film 165 and the transparent conductive film 166.

Figure 6:
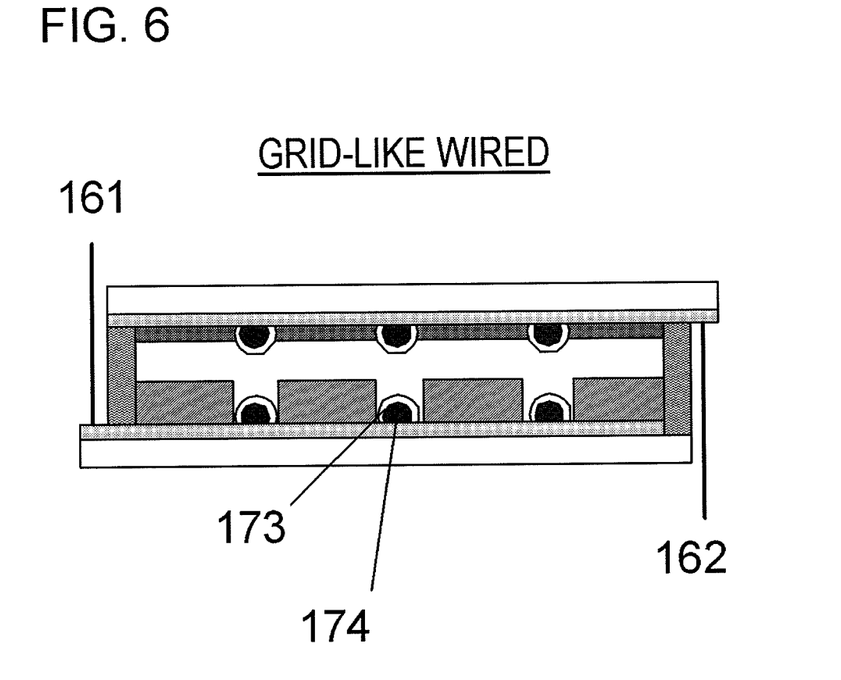
FIG. 6 is a sectional view illustrating the configuration of a photoelectric conversion element stack according to the embodiment.

The W-shaped, S-shaped, and Z-shaped stack modules shown in FIGS. 3 to 5 are stack modules in which small-sized cells are connected in series, but a grid-like wired module may be employed as shown in FIG. 6.

In FIG. 6, an electrolyte 168, a transparent conductive film 165, and a transparent conductive film 166 are disposed in common to plural elements and metallic collection wires 174 are disposed at predetermined positions on the transparent conductive film 165 and the transparent conductive film 166. Each metallic collection wire 174 is covered with an insulating film 173 and is thus insulated from the electrolyte 168.

The grid-like wired module is a module that can further decrease the power collection loss when a cell is increased in area. The grid-like wired modules may be stacked in the Z, W, or S shape.

In FIGS. 3 to 6, light is incident from the side of the photoelectrode 167. In the W-shaped stack module shown in FIG. 3, light is incident from both sides. By employing a substrate having a high light-transmitting property as the substrate of the counter electrode 169, it is possible to enable light to be incident from both sides.

In FIGS. 3 to 6, it has been stated that the transparent substrate 163 and the transparent substrate 164 are used as the substrates. However, for example, a material not having a light-transmitting property may be used for the substrate of the counter electrode in the W-shaped, S-shaped, and grid-like wired stack modules. Examples of this material include PEEK, SUS, and Si.

While the embodiments of the invention have been described with reference to the accompanying drawings, theses are only examples of the invention and various configurations other than the above-mentioned configurations may be employed.

Figure 7:
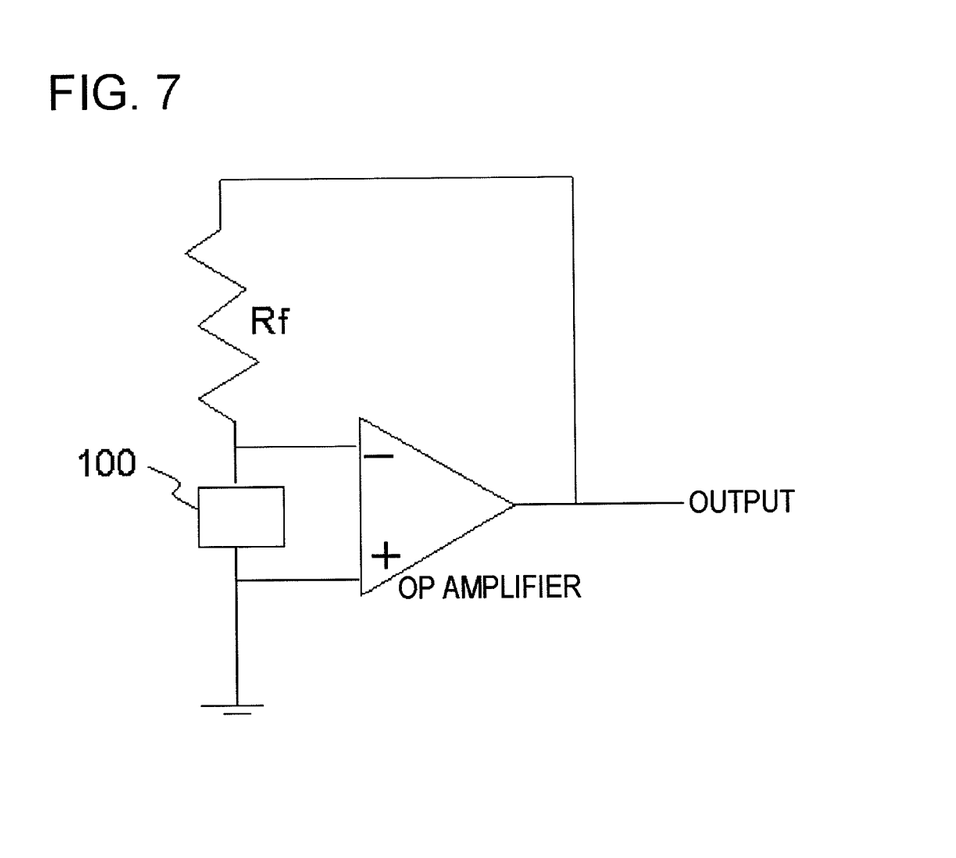
FIG. 7 is a diagram illustrating the circuit configuration of an optical sensor according to the embodiment.

For example, the photoelectric conversion element according to the embodiments may be used in an optical sensor in addition to a solar cell. FIG. 7 is a diagram illustrating the circuit configuration of an optical sensor including the photoelectric conversion element 100 (FIG. 1).

EXAMPLES

Examples of the invention will be specifically described below, but the invention is not limited to the examples.

In the following examples, a solar cell including the photoelectric conversion element 100 (FIG. 1) according to the invention was manufactured.

Example 1

1. Formation of Semiconductor Electrode

A semiconductor layer was formed in the following procedure. First, 5 g of a commercially-available titanium dioxide powder (product name: P25, made by Nippon Aerosil Co., Ltd.), 0.1 mL of a surfactant (product name: Triton X-100, made by Sigma-Aldrich Co., Ltd.), and 0.3 g of polyethylene glycol (with a molecular weight of 20,000) were added using 20 mL of an acetic acid solution with a concentraitn of 15 vol % as a solvent, and were stirred with a stirring mixer for about 1 hour (10 minutes per time) to prepare a titanium dioxide paste. Then, the titanium dioxide paste was applied by an appropriate amount (application area: 3 cm×3 cm) onto an ITO glass substrate (6 cm×4 cm, sheet resistance: 20 Ω/□) so as to have a thickness of 20 μm by the use of a doctor blade method. The resultant electrode was inserted into an electric furnace and was baked in the air atmosphere at 450° C. for about 30 minutes, whereby a semiconductor electrode was obtained.

2. Adsorption of Dye

Then, 2-phenyl-4,4,5,5-tetraalkylimidazoline-1-oxyl-3-oxide expressed by Formula 3 was dissolved in dehydrated ethanol with a concentration of 4×10−4 mol/L to prepare an adsorbing dye solution. The adsorbing dye solution and the semiconductor solution 108 were placed into a vessel and were left for 12 hours to adsorb the dye. Thereafter, the resultant was washed with dehydrated ethanol several times and was naturally dried at 50° C. for about 30 minutes.

[Chem. 4]

(3)

3. Injection of Electrolyte

The electrolyte used as the electrolyte layer 104 was produced by adjusting the concentrations of iodine, lithium iodide, 4-tert-butylpyridine, and 1,2-dimethyl-3-propylimidazolium iodide to be 0.5 mol/L, 0.1 mol/L, 0.5 mol/L, and 0.6 mol/L, respectively, using methoxypropionitrile as a solvent. The electrolyte is filled on the semiconductor electrode 108 and then was sufficiently infiltrated by placing the resultant in a vacuum state formed by a rotary pump for about 10 minutes. The counter electrode 109 having a platinum catalyst layer (the catalyst layer 105) was disposed and fixed with a jig. After manufacturing the element, the resultant structure was sealed with an epoxy resin so as to avoid the contact with the outside, thereby manufacturing the photoelectric conversion element 100.

Example 2

In Example 2, a photoelectric conversion element 100 was manufactured in the same manner as in Example 1, except that 2-(4-carboxylphenyl)-4,4,5,5-tetramethylimidazoline-1-oxyl-3-oxide expressed by Formula 2 was used instead of the 2-phenyl-4,4,5,5-tetramethylimidazoline-1-oxyl-3-oxide used as the dye in Example 1.

[Chem. 5]

(2)

Comparative Example

In a comparative example, the dye was not used and the semiconductor electrode was assembled as it was to manufacture a photoelectric conversion element.

(Evaluation of Stability in Characteristics of Solar Cell)

The photoelectric conversion elements prepared in Examples 1 and 2 and Comparative Example were evaluated. The I-V measurement was carried out under the irradiating conditions of AM 1.5 and 100 mW/cm2 by the use of a solar simulator. Here, both ends of the photoelectric conversion elements were connected to an electronic load and the potential scanning of a 5 mV/sec step was repeatedly carried out from an open voltage until the voltage is zero. The obtained I-V curves were shown in FIG. 8.

Figure 8:
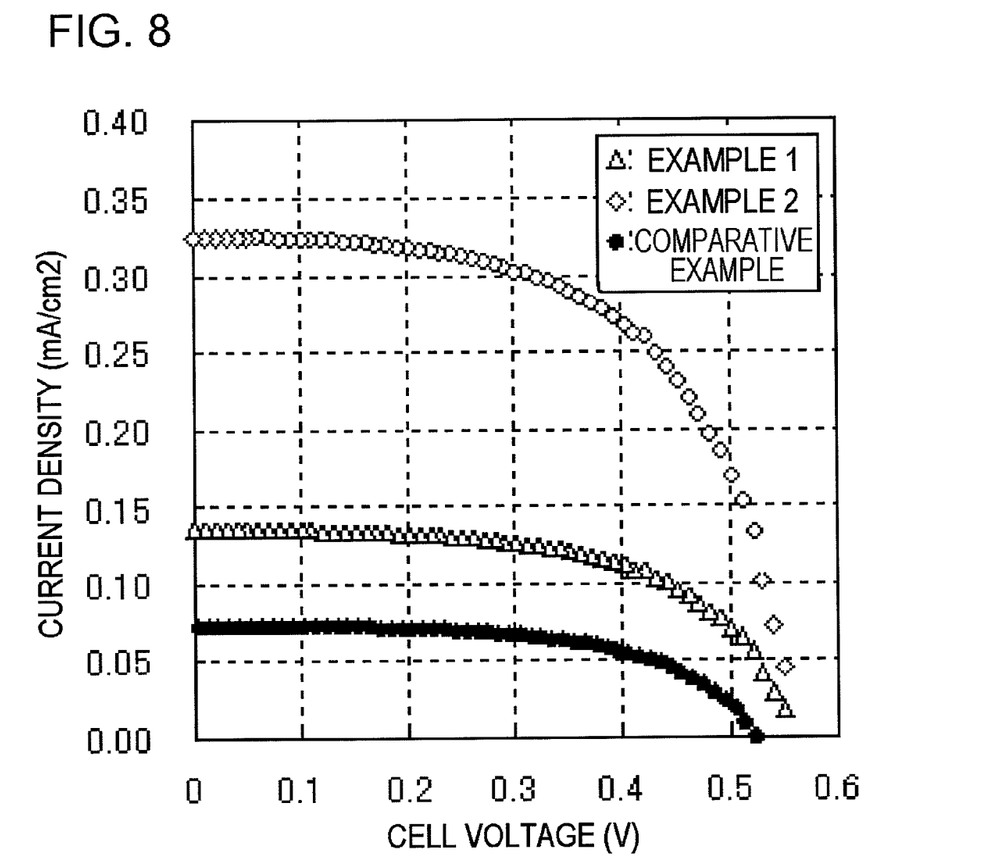
FIG. 8 is a diagram illustrating an I-V curve of the optical conversion element according to the embodiment.

As shown in FIG. 8, in the solar cells according to Examples 1 and 2, the short-circuit current was greatly improved in comparison with the element according to the comparative example. This is because the dye having the structure of aromatic-substituted 4,4,5,5-tetraalkylimidazoline-1-oxyl-3-oxide used in Examples 1 and 2 effectively exhibits the sensitizing effect for the semiconductor layer 103. Particularly, such an effect is more marked in Examples 2 in which the carboxyl group was introduced. In this way, according to the examples, it is possible to provide a photoelectric conversion element with high usefulness at a relatively low cost.

This application claims the priority based on Japanese Patent Application No. 2009-053152 filed Mar. 6, 2009, details of which are incorporated herein by reference.

The invention claimed is:

1. A photoelectric conversion element comprising: a semiconductor electrode that includes a semiconductor layer;
a counter electrode;
an electrolyte layer that is disposed between the semiconductor electrode and the counter electrode; and
a compound adsorbed to the semiconductor layer that is expressed by General Formula 2:

(2)

2. The photoelectric conversion element according to claim 1, further comprising a compound expressed by General Formula 1:

(1)

wherein A in the compound expressed by General Formula 1 has one or more substituents selected from the group consisting of an alkoxy group, a hydroxyl group, a hydrooxyalkyl group, a sulfonate group, an ester group, a mercapto group, and a phosphonyl group.

3. The photoelectric conversion element according to claim 1, wherein the semiconductor layer is formed of a semiconductor material containing titanium dioxide.

4. The photoelectric conversion element according to claim 1, wherein the electrolyte layer is formed of an electrolyte solution in which an electrolyte is dissolved in an organic solvent, and
wherein the electrolyte contains iodine and iodide ions.

* * * * *